United States Patent
Shin et al.

(10) Patent No.: US 11,815,801 B2
(45) Date of Patent: Nov. 14, 2023

(54) REFLECTIVE TYPE BLANKMASK AND PHOTOMASK FOR EUV

(71) Applicant: S&S TECH Co., Ltd., Daegu-si (KR)

(72) Inventors: Cheol Shin, Daegu-si (KR); Jong-Hwa Lee, Daegu-si (KR); Chul-Kyu Yang, Daegu-si (KR); Gil-Woo Kong, Daegu-si (KR)

(73) Assignee: S & S TECH CO., LTD., Daegu-si (KR)

(*) Notice: Subject to any disclaimer, the term of this patent is extended or adjusted under 35 U.S.C. 154(b) by 281 days.

(21) Appl. No.: 17/144,416

(22) Filed: Jan. 8, 2021

(65) Prior Publication Data
US 2021/0208495 A1 Jul. 8, 2021

(30) Foreign Application Priority Data
Jan. 8, 2020 (KR) .................. 10-2020-0002429

(51) Int. Cl.
| | |
|---|---|
| G03F 1/24 | (2012.01) |
| G03F 1/58 | (2012.01) |
| G03F 1/40 | (2012.01) |
| H01L 21/033 | (2006.01) |

(52) U.S. Cl.
CPC .............. G03F 1/24 (2013.01); G03F 1/40 (2013.01); G03F 1/58 (2013.01); H01L 21/0332 (2013.01); H01L 21/0337 (2013.01)

(58) Field of Classification Search
CPC ..... G03F 1/24; G03F 1/58; G03F 1/22; G03F 1/52; G03F 1/60
See application file for complete search history.

(56) References Cited

U.S. PATENT DOCUMENTS

| | | | |
|---|---|---|---|
| 2005/0208389 A1* | 9/2005 | Ishibashi | G03F 1/58 430/5 |
| 2009/0253055 A1* | 10/2009 | Hayashi | B82Y 40/00 428/141 |
| 2010/0003516 A1 | 2/2010 | Hayashi et al. | |
| 2011/0010459 A1 | 5/2011 | Hayashi et al. | |
| 2011/0281207 A1 | 11/2011 | Hosoya | |

(Continued)

FOREIGN PATENT DOCUMENTS

| | | |
|---|---|---|
| JP | 2004-6798 A | 1/2004 |
| JP | 2020034666 A | 3/2020 |

(Continued)

OTHER PUBLICATIONS

Korean Office Action dated Jan. 11, 2021 in counterpart Korean application 10-2020-0002429, 10 pages in Korean.

(Continued)

*Primary Examiner* — Stewart A Fraser
(74) *Attorney, Agent, or Firm* — Juan Carlos A. Marquez; Marquez IP Law Office, PLLC

(57) ABSTRACT

Disclosed is a blankmask for EUV includes a substrate, a reflection film that is stacked on the substrate; and an absorbing film that is stacked on the reflection film. The absorbing film is constituted by an uppermost layer and a plurality of layers under the uppermost layer. The uppermost layer contains Ta and O. The plurality of layers contain Ta and are configured so that a content of N increases upward. As a result, a CD deviation of a pattern of the absorbing film is minimized.

18 Claims, 6 Drawing Sheets

(56) References Cited

U.S. PATENT DOCUMENTS

| | | | |
|---|---|---|---|
| 2012/0322000 A1* | 12/2012 | Uno | C23C 14/0036 |
| | | | 430/5 |
| 2013/0078554 A1 | 3/2013 | Sakai et al. | |
| 2013/0316272 A1 | 11/2013 | Hayashi et al. | |
| 2018/0031964 A1* | 2/2018 | Jindal | G03F 1/52 |
| 2018/0335693 A1 | 11/2018 | Hiromatsu et al. | |
| 2018/0356719 A1 | 12/2018 | Ikebe et al. | |
| 2019/0369482 A1 | 12/2019 | Inazuki | |
| 2019/0384156 A1 | 12/2019 | Tanabe | |
| 2021/0208495 A1* | 7/2021 | Shin | H01L 21/0337 |
| 2021/0031138 A1 | 10/2021 | Kataoka et al. | |

FOREIGN PATENT DOCUMENTS

| | | | |
|---|---|---|---|
| KR | 10-2013-0034634 A | 4/2013 | |
| KR | 10-2015-0056435 A | 5/2015 | |
| KR | 10-2017-0021191 A | 2/2017 | |
| KR | 10-2018-0127197 A | 11/2018 | |
| KR | 10-2019-0136960 A | 12/2019 | |
| TW | 201518855 A | 5/2015 | |
| TW | 201730663 A | 9/2017 | |
| TW | I623805 B | 5/2018 | |
| TW | 202000954 A | 1/2020 | |
| WO | 2008129908 A1 | 10/2008 | |
| WO | 2010007955 A1 | 1/2010 | |
| WO | 2010090132 A1 | 8/2010 | |
| WO | 2012105508 A1 | 8/2012 | |

OTHER PUBLICATIONS

Japanese Office Action dated Nov. 30, 2021 in counterpart Japanese application 2021-001365, 6 pages in Japanese.

Taiwan Office Action dated Dec. 15, 2021 in counterpart Taiwan application 110100543, 5 pages in Chinese.

Korean Notice of Allowance dated Jul. 26, 2021 in counterpart Korean application 10-2020-0002429, 2 pages in Korean.

* cited by examiner

REFLECTIVE TYPE BLANKMASK AND PHOTOMASK FOR EUV

CROSS-REFERENCE TO RELATED APPLICATION

This application is based on and claims priority under 35 U. S. C. § 119 to Korean Patent Application No. 10-2020-0002429, filed on Jan. 8, 2020, the disclosure of which is herein incorporated by reference in its entirety.

BACKGROUND

1. Field

The disclosure relates to a blankmask for extreme ultraviolet (hereinafter, EUV) that uses extreme ultraviolet light used in semiconductor manufacturing as exposure light.

2. Discussion of Related Art

In order to refine a semiconductor circuit pattern, the use of 13.5 nm of extreme ultraviolet (EUV) as exposure light is being pursued. In the case of a photomask for forming a circuit pattern on a substrate using the EUV, a reflective type photomask that reflects the exposure light and irradiates the reflected exposure light to a wafer is mainly used. FIG. 1 is a diagram illustrating an example of a reflective type blankmask for manufacturing a reflective type photomask.

As illustrated in FIG. 1, a reflective type blankmask for EUV is configured to include a substrate 102, a reflection film 104 formed on the substrate 102, an absorbing film 106 formed on the reflection film 104, and a resist film 108 formed on the absorbing film 106. The reflection film 104 is formed in a structure in which, for example, a molybdenum (Mo) layer made of a Mo material and a silicone (Si) layer made of a Si material are alternately stacked tens of times, and serves to reflect incident exposure light. The absorbing film 106 generally has a two-layer structure of a lower layer 106a made of a TaBN material and an upper layer 106b made of a TaBON material, and serves to absorb incident exposure light. The resist film 108 is used to pattern the absorbing film 106. As the absorbing film 106 is patterned into a predetermined shape, the blankmask is manufactured as a photomask, and the EUV exposure light incident on the photomask is absorbed or reflected according to the pattern of the absorbing film 106 and then irradiated onto a semiconductor wafer.

FIGS. 2 and 3 are diagrams illustrating one pattern of the absorbing film obtained by patterning the absorbing film 106 in the photomask manufactured with the blankmask of FIG. 1 (in FIGS. 2 and 3, the patterns of each layer 106a and 106b of the absorbing film 106 of FIG. 1 are indicated by the same reference numerals as the layers 106a and 106b.).

As illustrated in FIG. 2, patterns of the absorbing films 106a and 106b manufactured by etching the absorbing film 106 using the pattern of the resist film 108 are inclined at their sides. This is because the time when the absorbing film 106 is exposed to the etching gas increases toward the top of the absorbing film 106. As the inclination increases, a thickness t1 of a lower portion of the lower layer 106a of the patterns of the absorbing film 106a and 106b becomes larger than a thickness t2 of an upper portion thereof. In addition, footing is formed under the lower layer 106b. Due to this phenomenon, a difference from a designed critical dimension (CD) occurs, and therefore, the accuracy of a circuit pattern manufactured by a photomask deteriorates.

In order to solve the footing problem, a method of rapidly configuring an etching rate of the lower layer 106a of the absorbing film 106 in the blankmask of FIG. 1 has been proposed. However, as illustrated in FIG. 3, when the etching rate of the lower layer 106a is high, skew appears above the lower layer 106a, that is, at a portion of the lower layer 106a in contact with the upper layer 106b. Due to this phenomenon, the image contrast of the mask pattern decreases, and the accuracy of the circuit pattern manufactured by the photomask decreases. Therefore, a need exists for a method of verticalizing a profile of a pattern of an absorbing film.

SUMMARY

The disclosure is to provide a blankmask for EUV capable of minimizing CD deviation of a pattern of an absorbing film.

According to an embodiment of the disclosure, a blankmask for EUV includes a substrate, a reflection film formed on the substrate, and an absorbing film formed on the reflection film, wherein the absorbing film is constituted by an uppermost layer and a plurality of layers under the uppermost layer, and the plurality of layers contain Ta and are configured so that a content of N increases upward.

The plurality of layers may include a first layer formed on the reflection film and a second layer formed on the first layer.

Each of the first layer and the second layer may have a thickness of 1 to 50 nm.

The absorbing film may additionally contain one or more of Pt, Ni, Cr, Mo, V, Co, Ag, Sb, Bi, Co, Sn, Te, Zr, Si, Nb, Pd, Zn, Al, Mn, Cd, Se, Cu, Hf, and W.

The absorbing film may additionally contain one or more of C, B, and H.

The first layer may be configured to have a thicker thickness than the second layer. The second layer may have a thickness of 1 to 5 nm, and a sum of the thicknesses of the first layer and the second layer may be 40 nm or more. The first layer may have a ratio of Ta:N=60 at %:40 at % to 100 at %:0 at %, and the second layer may have a ratio of Ta:N=59 at %:41 at % to 90 at %:10 at %. The second layer may be configured such that the content of N is 1 to 20 at % higher than that of the first layer.

The second layer may be configured to have a thicker thickness than the first layer. The first layer may have a thickness of 5 nm or more, and a sum of the thicknesses of the first layer and the second layer may be 40 nm or more. The first layer may have a ratio of Ta:N=61 at %:39 at % to 100 at %:0 at %, and the second layer may have a ratio of Ta:N=60 at %:40 at % to 99 at %:1 at %. The second layer may be configured such that the content of N is 1 to 20 at % higher than that of the first layer.

The uppermost layer may contain oxygen (O) and the plurality of layers may not contain oxygen (O). The uppermost layer may have a thickness of 2 to 5 nm. The uppermost layer may have an etching selectivity of 5 or more for the plurality of layers.

The reflection film may have a structure in which a Mo layer and a Si layer are alternately arranged.

A conductive film may be formed on a backside of the substrate.

According to another embodiment of the disclosure, a photomask manufactured with the blankmask configured as described above is provided.

According to the disclosure, the blankmask for EUV capable of minimizing the CD deviation of the pattern of the absorbing film is provided.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Hereinafter, the disclosure has been specifically described through the structure of the disclosure with reference to the accompanying drawings, but this structure is only used for the purpose of illustrating and explaining the disclosure, and is not used to limit the meaning or the scope of the disclosure described in the claims. Therefore, those having ordinary skill in the technical field of the disclosure can understand that various modifications and equivalent other embodiments are possible from the embodiments. Accordingly, an actual technical scope of the disclosure is to be defined by the spirit of the appended claims.

Figure 1:
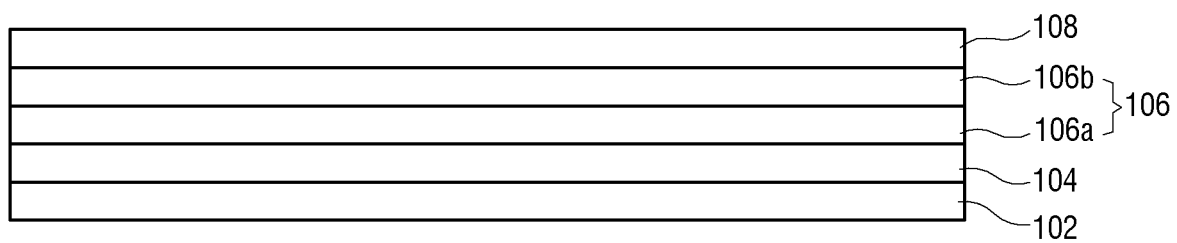
FIG. 1 is a diagram schematically illustrating a structure of a conventional general reflective type blankmask for EUV.
Figure 2:
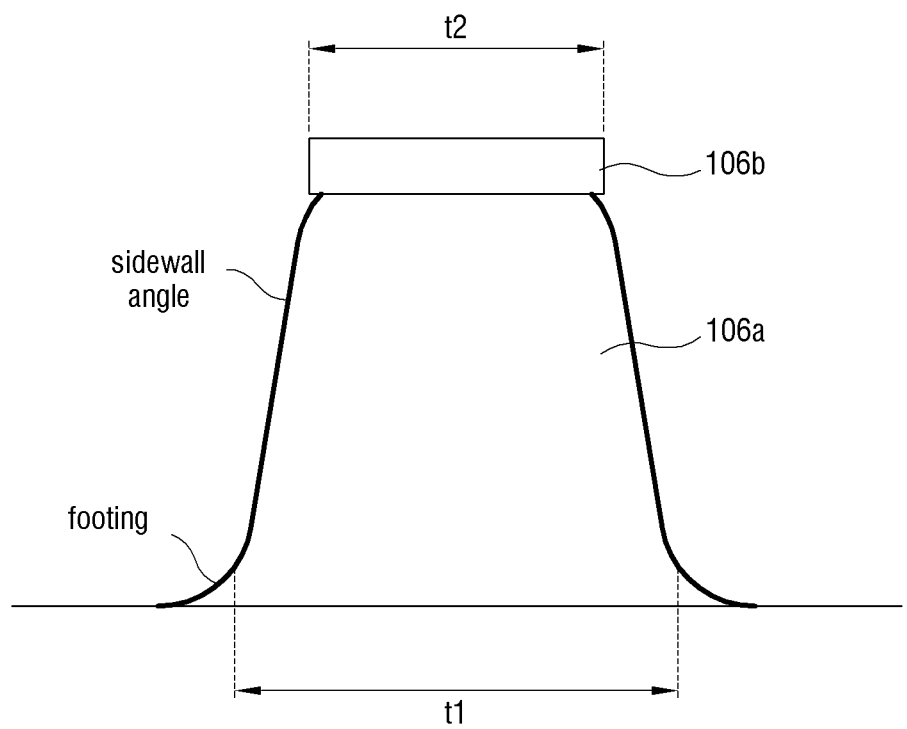
FIGS. 2 and 3 are diagrams illustrating a pattern of an absorbing film of a photomask manufactured with the blankmask of FIG. 1.
Figure 3:
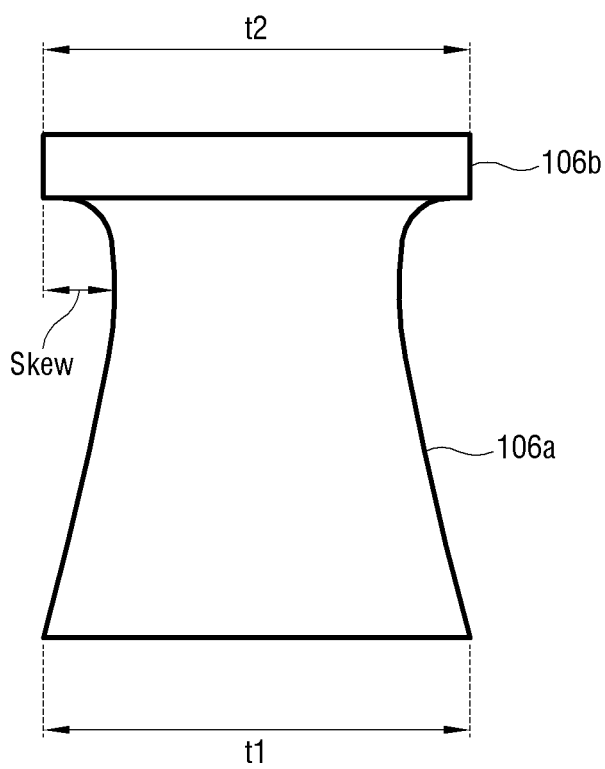
Figure 4:
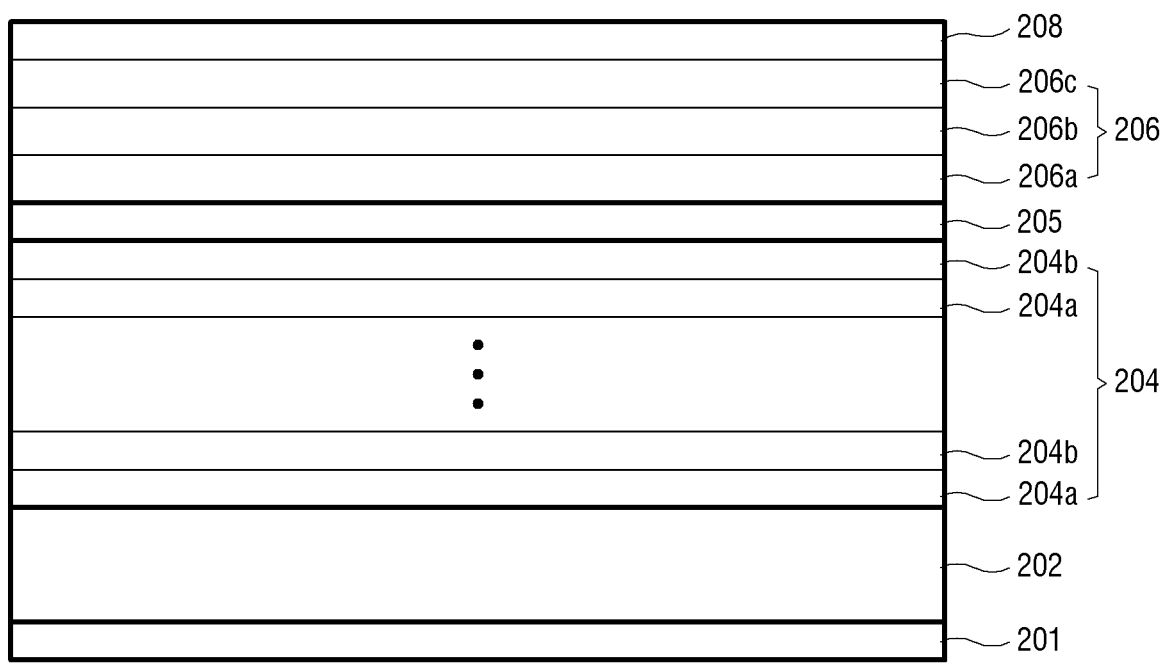
FIG. 4 is a diagram illustrating a structure of a reflective type blankmask for EUV according to the disclosure.

FIG. 4 is a diagram illustrating a structure of a reflective type blankmask for EUV according to the disclosure.

The reflective type blankmask for EUV according to the disclosure includes a substrate 202, a reflection film 204 formed on the substrate 202, an absorbing film 206 formed on the reflection film 204, and a resist film 208 formed on the absorbing film 206. In addition, the blankmask of the disclosure further includes a conductive film 201 formed on a backside of the substrate 202 and a capping film 205 formed between the reflection film 204 and the absorbing film 206.

The substrate 202 is a glass substrate for a reflective type blankmask using EUV exposure light, and is configured as a low thermal expansion material (LTEM) substrate having a low coefficient of thermal expansion within the range of $0 \pm 1.0 \times 10^{-7}/°$ C. and preferably $0 \pm 0.3 \times 10^{-7}/°$ C. in order to prevent deformation of a pattern due to heat and stress during exposure. As the material of the substrate 202, $SiO_2$—$TiO_2$-based glass, multi-component glass ceramic, or the like may be used.

The substrate 202 requires high flatness in order to increase accuracy of reflected light during the exposure. The flatness is represented by a total indicated reading (TIR) value, and it is preferable that the substrate 202 has a low TIR value. The flatness of the substrate 202 is 100 nm or less and preferably 50 nm or less in an area of 132 mm² or an area of 142 mm².

The reflection film 204 has a function of reflecting EUV exposure light, and has a multilayer structure having a different refractive index of each layer. Specifically, the reflection film 204 is formed by alternately stacking a Mo layer 204a made of a Mo material and a Si layer 204b made of a Si material 40 to 60 times. The reflection film 204 requires high reflectivity at a wavelength of 13.5 nm in order to improve the image contrast, and the reflection intensity of the reflection film varies depending on an incident angle of exposure light and a thickness of each layer. For example, when the incident angle of the exposure light is 5 to 6°, it is preferable that the Mo layer and the Si layer have a thickness of 2.8 nm and 4.2 nm, respectively, but when an incident angle is widened to 8 to 14° due to the enlargement of a lens for application of a high numerical aperture (NA) method, the Mo layer 204a may be formed to a thickness of 2 to 4 nm and the Si layer 204b may be formed to have a thickness of 3 to 5 nm in order to have a reflection intensity optimized for the incident angle.

The reflection film 204 has a reflectance of 65% or more with respect to the EUV exposure light of 13.5 nm.

The reflection film 204 is configured such that the surface TIR has a value of 1,000 nm or less, preferably 500 nm or less, and more preferably 300 nm or less. When the surface flatness of the reflection film 204 is poor, an error occurs in a position where the EUV exposure light is reflected, and as the position error is high, the position error of the critical dimension (CD) arises.

The reflection film 204 has a surface roughness of 0.5 nm Ra or less, preferably 0.3 nm Ra or less, and more preferably 0.1 nm Ra or less in order to suppress diffuse reflection of the EUV exposure light.

The capping film 205 is formed on the reflection film 204, and serves to protect the reflection film 204 thereunder during a dry etching process or a cleaning process for patterning the absorbing film 206. The capping film 104 is made of a material containing Ru.

The absorbing film 206 is formed on the capping film 205 and serves to absorb the exposure light. Specifically, the absorbing film 206 has a reflectance of 10% or less and preferably a reflectance of 1 to 8% with respect to EUV exposure light having a wavelength of 13.5 nm, and thus absorbs most of the exposure light. The absorbing film 206 preferably has an extinction coefficient (k) of 0.03 or more for the EUV exposure light having a wavelength of 13.5 nm. The absorbing film 206 has a thickness of 55 nm or less.

The absorbing film 206 is constituted by a plurality of layers. In the embodiment of FIG. 4, the absorbing film 206 is constituted by a third layer 206c constituting an uppermost layer and a plurality of layers under the third layer 206c. The plurality of layers under the third layer 206c are constituted by a first layer 206a and a second layer 206b. The first layer 206a is formed on the reflection film 204, and the second layer 206b is formed on the first layer 206a. In the embodiment of FIG. 4, the absorbing film 206 is constituted by three layers, but may be constituted by four or more layers. In addition, each layer may be constituted by a plurality of sub-layers having different compositions or different composition ratios. In addition, in this embodiment and the following embodiments, layers such as the first layer, the second layer, and the third layer do not mean that each layer is constituted by a single layer, and include examples in which each layer is constituted by a plurality of sub-layers or each layer is constituted by a continuous film type layer whose composition ratio is continuously changed. In addition, in the following description, for example, the description that the content of nitrogen increases upward of a plurality of layers includes all cases where the content of nitrogen of each sub-layer in one layer increases or decreases upward or is the same. The same applies to the claims of the present invention and should be interpreted.

The absorbing film 206 is made of a material containing Ta. In addition, the absorbing film 206 may be made of a material additionally containing one or more of Pt, Ni, Cr, Mo, V, Co, Ag, Sb, Bi, Co, Sn, Te, Zr, Si, Nb, Pd, Zn, Al, Mn, Cd, Se, Cu, Hf, and W.

The absorbing film 206 is made of a material containing nitrogen (N). At this time, the plurality of layers 206a, 206b, and 206c constituting the absorbing film 206, in particular, the first layer 206a and the second layer 206b are configured such that the content of nitrogen (N) increases upward. Therefore, the content of N in the second layer 206b is greater than that of the first layer 206a. When N is included in Ta, the etching rate increases as the content of N decreases during etching with a chlorine-based gas such as $Cl_2$, $SiCl_4$, and $CHCl_3$. Accordingly, the first layer 206a has a higher etching rate than the second layer 206b. Accordingly, when patterning the absorbing film 206, the inclination of the pattern becomes close to the vertical, so the width of the pattern of the first layer 206a is prevented from becoming larger than the width of the pattern of the second layer 206b. Accordingly, the CD deviation is reduced. Meanwhile, each of the layers 206a to 206c of the absorbing film 206 may additionally contain one or more of carbon (C), boron (B), and hydrogen (H).

On the other hand, the third layer 206c, which is the uppermost layer of the absorbing film 206, contains oxygen (O), and the other layers except for the third layer 206c are configured not to contain O. The third layer 206c may not contain N. When O is contained in the Ta material, the third layer 206c is etched by a fluorine-based gas such as $F_2$, $SF_6$, and $CF_4$, and therefore, the third layer 206c has an etching selectivity for the layers 206b and 206a thereunder. Preferably, the third layer 206c has an etching selectivity of 5 or more, and more preferably, an etching selectivity of 10 or more compared to the layers 206b and 206a thereunder.

Since the etching material of the third layer 206c is different from the etching material of the layers 206b and 206a thereunder, the absorbing film 206 is etched through a two-step etching process of a first etching process for the third layer 206c and a second etching process for the second layer 206b and the first layer 206a. The resist film 208 is gradually damaged while the absorbing film 206 is etched using the pattern of the resist film 208, so the resist film 208 may normally not perform a function of an etching mask for etching the absorbing film 206. In order to prevent this, when the resist film 208 is formed thick, the accuracy of the pattern of the resist film 208 decreases, which leads to a decrease in the accuracy of the pattern of the absorbing film 206. Therefore, in the disclosure, the third layer 206c of the absorbing film 206 is first etched using the pattern of the resist film 208 to form the pattern of the third layer 206c of the absorbing film 206, and the second layer 206b and the first layer 206a of the absorbing film 206 are etched by using the pattern of the third layer 206c of the absorbing film 206 together with the pattern of the resist film 208 as the etching mask. As the third layer 206c serves as an etching mask as described above, it is possible to form the resist film 208 thinly, thereby increasing the accuracy of the pattern of the absorbing film 206. The third layer 206c may improve adhesion to the resist film 208 by performing surface treatment such as HMDS treatment on the upper portion thereof.

The first layer 206a and the second layer 206b may each have a thickness of 1 to 50 nm. In addition, the third layer 206c functions as an etching mask as described above, and therefore, is formed to have a thickness of 2 to 5 nm, which is thinner than the first layer 206a and the second layer 206b. When the thickness of the third layer 206c is 2 nm or less, it is difficult for the third layer 206c to serve as the etching mask, and when the thickness of the third layer 206c is 5 nm or more, there is a problem that the entire thickness of the absorbing film 206 is thickened to secure desired optical properties.

The third layer 206c of the absorbing film 206 is preferably made of a Ta compound having the content of oxygen (O) of 50 to 90 at %. When the content of O is 50 at % or less, it is difficult to secure a high etching selectivity for a TaN material under the third layer 206c, and the etching rate may decrease during fluorine-based etching, resulting in the formation of a residual film. Thereafter, when the lower layers 206b and 206a are etched with a chlorine-based gas, there is a problem in that the etching rate is significantly reduced.

The resist film 208 is made of a chemically amplified resist (CAR). The resist film 208 has a thickness of 150 nm or less and preferably 100 nm or less.

The conductive film 201 is formed on the backside of the substrate 201. The conductive film 201 has a lower sheet resistance value to serve to improve adhesion between an electronic-chuck and the blankmask for EUV, and prevent particles from being generated due to friction with the electronic-chuck. The conductive film 201 has a sheet resistance of 100Ω/□ or less, preferably 50Ω/□ or less, and more preferably 20Ω/□ or less. The conductive film 201 may be configured in the form of a single film, a continuous film, or a multilayer film. The conductive film 201 may be made of, for example, Cr as a main component, and when the conductive film 201 is constituted by a two-layer multilayer film, the lower layer may contain Cr and N, and the upper layer may contain Cr, N, and O.

According to the above configuration, since the content of nitrogen of the first layer 206a and the second layer 206b of the absorbing film 206 increases upward, the etching rate increases downward. Accordingly, the inclination of the absorbing film 206 becomes steep and the CD deviation decreases.

In addition, since the third layer 206c of the absorbing film 206 has the etching selectivity with respect to the layers 206a and 206b thereunder, the third layer 206c serves as the etching mask for the layers 206a and 206b thereunder. Therefore, it is possible to form the more precise pattern.

Figure 5:
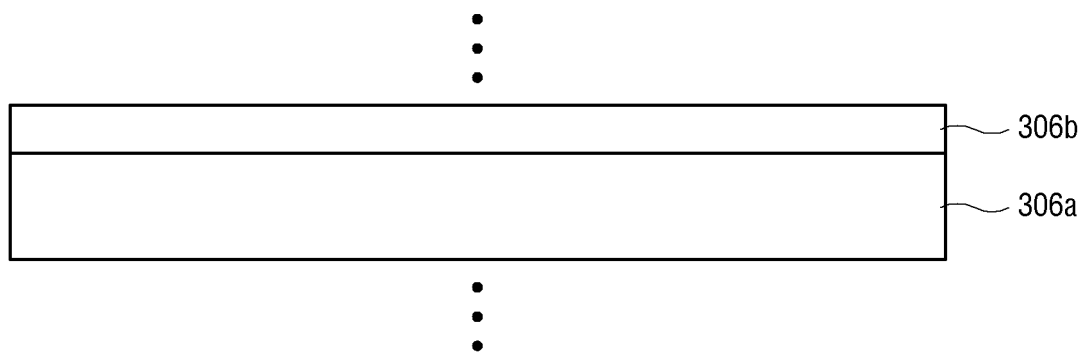
FIG. 5 is a diagram illustrating a structure of a reflective type blankmask for EUV according to a first modification of FIG. 4.

FIG. 5 is a diagram illustrating a structure of a reflective type blankmask for EUV according to a first modification of FIG. 4, and is a diagram illustrating only a first layer 306a and a second layer 306b of the absorbing film. In FIG. 5, the configurations other than the first layer 306a and the second layer 306b of the absorbing film are omitted, and the omitted portions have the same configuration as the embodiment illustrated in FIG. 4.

In this modification, the first layer 306a has a thicker thickness than the second layer 306b. The first layer 306a and the second layer 306b are configured such that the sum of their thicknesses is 40 nm or more. When the sum of the thicknesses is 40 nm or less, it is difficult to secure the desired reflectance.

The first layer 306a has a ratio of Ta:N=60 at %:40 at % to 100 at %:0 at %. When the content of Ta of the first layer 306a is 60 at % or less, it is difficult to secure a low reflectance for EUV exposure light.

The second layer 306b has a ratio of Ta:N=59 at %:41 at % to 90 at %:10 at %. The second layer 306b is preferably configured such that the content of N is 1 to 20 at % higher than that of the first layer 306a. The second layer 306b has a thickness of 1 to 5 nm. When the second layer 306b has a thickness of 1 nm or less, the increase in the content of N is 1 at % or less compared to the first layer 306a, or Ta is 90% or more, CD correction for the side etching of the absorbing film is difficult. In addition, when the second layer 206b has an increase in N of 20 at % or more or a composition of N of 41 at % or more compared to the first layer 306a, a pattern profile deteriorates due to the low etching rate when the absorbing film is etched.

According to this configuration, as described above, the characteristics of the inclination of the pattern of the absorbing film may be improved and the skew in the side of the absorbing film may be additionally improved.

Figure 6:
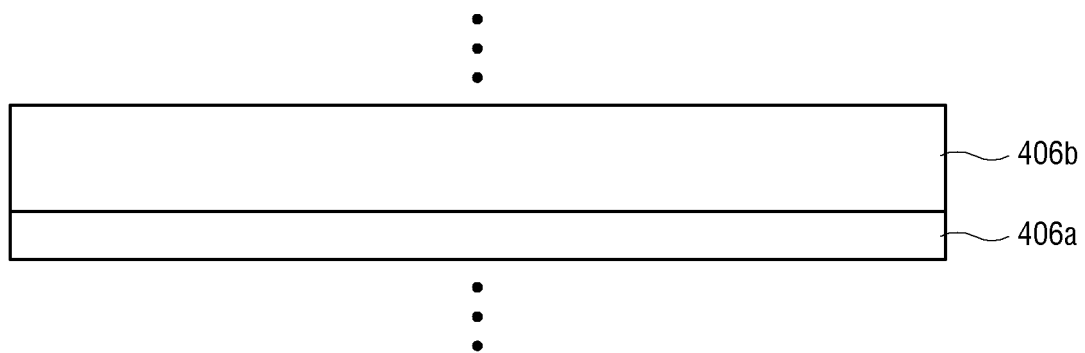
FIG. 6 is a diagram illustrating a structure of a reflective type blankmask for EUV according to a second modification of FIG. 4.

FIG. 6 is a diagram illustrating a structure of a reflective type blankmask for EUV according to a second modification of FIG. 4, and is a diagram illustrating only a first layer 406a and a second layer 406b of the absorbing film. In FIG. 5, the configurations other than the first layer 406a and the second layer 406b of the absorbing film are omitted, and the omitted portions have the same configuration as the embodiment illustrated in FIG. 4.

In this modification, the second layer 406b has a thicker thickness than the first layer 406a. In this case, the first layer 406a and the second layer 406b are preferably configured such that the sum of their thicknesses is 40 nm or more. When the sum of the thicknesses is 40 nm or less, it is difficult to secure the desired reflectance. In addition, the first layer 406a has a thickness of 5 nm or more. When the thickness of the first layer 406a is 5 nm or less, it is difficult to improve the footing.

The first layer 406a has a ratio of Ta:N=61 at %:39 at % to 100 at %:0 at %. When the content of Ta of the first layer 406a is 60 at % or less, it is difficult to secure a low reflectance for EUV exposure light, and since the content of N is 40 at % or more, it is difficult to improve the footing due to the low etching rate.

The second layer 406b has a ratio of Ta:N=60 at %:40 at % to 99 at %:1 at %. The second layer 406b is preferably configured such that the content of N is 1 to 20 at % higher than that of the first layer 406a. When the difference in the content of N between the first layer 405a and the second layer 406b is 1 at % or less, it is difficult to improve the footing. When the second layer 406b has the content of Ta of 60 at % or less, it is difficult to secure the desired reflectance.

According to this configuration, as described above, it is possible to improve the characteristics of the inclination of the pattern of the absorbing film and prevent the occurrence of footing, in particular, in the first layer 406a.

Hereinafter, specific implementation examples of the disclosure will be described.

In the blankmask for EUV, a conductive film 201 having a two-layer structure of a lower layer and an upper layer mainly made of Cr was formed on a backside of a SiO$_2$—TiO$_2$-based transparent substrate 202 using DC magnetron reactive sputtering equipment. Both the upper and lower conductive films were formed using a Cr target, and the conductive film of the lower layer was constituted by a CrN film by injecting Ar:N$_2$=5 sccm:5 sccm as a process gas, and using a process power of 1.4 kW. As a result of measuring the thickness of the lower layer of the conductive film using XRR equipment, the lower layer of the conductive film was measured to have a thickness of 51.0 nm. The conductive film of the upper layer was constituted by a CrON film by injecting Ar:N$_2$:NO=7 sccm:7 sccm:7 sccm as a process gas and using a process power of 1.4 kW. As a result of measuring the thickness of the upper layer of the conductive film using the XRR equipment, the upper layer of the conductive film was measured to have a thickness of 15.0 nm. As a result of measuring the sheet resistance of the conductive film 201 using a 4-point probe, it was confirmed that there is no problem in bonding with the electro-static chuck and there is no problem in use as the conductive film by showing a sheet resistance value of 22.6 Ω/□.

A 40-layer reflection film 204 was formed by alternately stacking a Mo layer and a Si layer on the entire surface of the substrate 202 on which the conductive film 201 was formed. After mounting a Mo target, a Si target, a B4C target, and a C target on the deposition equipment, the reflection film 204 was formed by sequentially forming a Mo layer, a B4C layer, a Si layer, and a C layer in an Ar gas atmosphere.

Specifically, the reflection film 204 was formed by repeatedly forming 40 cycles of four layers of a Mo layer formed to 2.8 nm, a B4C layer formed to 0.5 nm, a Si layer formed to 4.2 nm, and a C layer formed to 0.5 nm as one cycle, and the final surface of the reflection film 204 was formed to be the Si layer excluding the C layer in order to suppress the surface oxidation.

As a result of measuring the reflectance of the reflection film at 13.5 nm using the EUV reflectometer equipment, the reflectance was 66.2%, and then, as a result of measuring the surface roughness using the AFM equipment, the surface roughness was 0.125 nm Ra.

A capping film 205 that has a thickness of 2.5 nm and is made of Ru was formed on the reflection film 204 in a nitrogen atmosphere by using the deposition equipment and using a Ru target. After forming the capping film 205, as a result of measuring the reflectance in the same manner as the reflection film 204, the reflectance was 65.8% at a wavelength of 13.5 nm.

The absorbing film 206 having a three-layer structure of the first layer 206a, the second layer 206b, and the third layer 206c was formed on the capping layer 205 by using the deposition equipment Specifically, the first layer 206a of the absorbing film 206 was formed on the capping film 205 using the Ta target by injecting Ar:N$_2$=9 sccm:1 sccm as a process gas and using a process power of 0.62 kW. As a result of measuring the thickness of the first layer 206a using the XRR equipment, the first layer 206a was measured to have a thickness of 47.1 nm. The second layer 206b was formed on the first layer 206a using the same target by injecting Ar:N$_2$=9 sccm:5 sccm as a process gas and using a process power of 0.62 kW. As a result of measuring the thickness of the second layer 206b, the second layer 206b was measured to have a thickness of 5.0 nm. Thereafter, the third layer 206c constituted by a TaON film was formed on the second layer 206b using the same target by injecting a process gas of Ar:N$_2$:O$_2$=3 sccm:20 sccm:4.5 sccm and a process power of 0.62 kW. As a result of measuring the thickness of the third layer 206c, the third layer 206c was measured to have a thickness of 2.5 nm.

Thereafter, as a result of checking the composition ratio of the absorbing film 206 using auger electron spectroscopy (AES) equipment, in the first layer 206a, the content of Ta was 85.9% and the content of N was 14.1%, and in the second layer 206b, the content of Ta was 62.0% and the content of N was 38.2%. In the case of the third layer 206c, the content of Ta was 9.2%, the content of N was 13.8%, and the content of O was 77.0%.

A total thickness of the absorbing film 206 formed in the above process was 54.6 nm, reflectance was 3.0% at a wavelength of 13.5 nm, and a phase shift was 179°. The above result is determined to be a level that may be controlled in the range of a reflectance of 1 to 10% and a phase difference of 170 to 190° through the adjustment of the film formation conditions of the absorbing film 206.

Thereafter, the resist film 208 was spin coated on the absorbing film 206 to a thickness of 80 nm to complete the manufacturing of the blankmask for EUV.

What is claimed is:

1. A blankmask for EUV, comprising:
   a substrate;
   a reflection film formed on the substrate; and
   an absorbing film formed on the reflection film,
   wherein the absorbing film is constituted by an uppermost layer and a plurality of layers under the uppermost layer,
   the plurality of layers contains Ta and are configured so that a content of N increases upward, and
   the uppermost layer contains oxygen (O) and the plurality of layers do not contain oxygen (O).

2. The blankmask for EUV of claim 1, wherein the plurality of layers includes a first layer formed on the reflection film and a second layer formed on the first layer.

3. The blankmask for EUV of claim 2, wherein each of the first layer and the second layer has a thickness of 1 to 50 nm.

4. The blankmask for EUV of claim 2, wherein the first layer is thicker than the second layer.

5. The blankmask for EUV of claim 4, wherein the second layer has a thickness of 1 to 5 nm, and a sum of the thicknesses of the first layer and the second layer is 40 nm or more.

6. The blankmask for EUV of claim 4, wherein the first layer has a ratio of Ta:N=60 at %:40 at % to 100 at %:0 at %, and the second layer has a ratio of Ta:N=59 at %:41 at % to 90 at %:10 at %.

7. The blankmask for EUV of claim 6, wherein the second layer is configured such that the content of N is 1 to 20 at % higher than that of the first layer.

8. The blankmask for EUV of claim 2, wherein the second layer is thicker than the first layer.

9. The blankmask for EUV of claim 8, wherein the first layer has a thickness of 5 nm or more, and a sum of the thicknesses of the first layer and the second layer is 40 nm or more.

10. The blankmask for EUV of claim 8, wherein the first layer has a ratio of Ta:N=61 at %:39 at % to 100 at %:0 at %, and the second layer has a ratio of Ta:N=60 at %:40 at % to 99 at %:1 at %.

11. The blankmask for EUV of claim 10, wherein the second layer is configured such that the content of N is 1 to 20 at % higher than that of the first layer.

12. The blankmask for EUV of claim 1, wherein the absorbing film additionally contains one or more of Pt, Ni, Cr, Mo, V, Co, Ag, Sb, Bi, Co, Sn, Te, Zr, Si, Nb, Pd, Zn, Al, Mn, Cd, Se, Cu, Hf, and W.

13. The blankmask for EUV of claim 1, wherein the absorbing film additionally contains one or more of C, B, and H.

14. The blankmask for EUV of claim 1, wherein the uppermost layer has a thickness of 2 to 5 nm.

15. The blankmask for EUV of claim 14, wherein the uppermost layer has an etching selectivity of 5 or more for the plurality of layers.

16. The blankmask for EUV of claim 1, wherein the reflection film has a structure in which a Mo layer and a Si layer are alternately arranged.

17. The blankmask for EUV of claim 1, further comprising:
    a conductive film formed on a backside of the substrate.

18. A photomask manufactured with a blankmask for EUV, the blankmask comprising:
    a substrate;
    a reflection film formed on the substrate; and
    an absorbing film formed on the reflection film,
    wherein the absorbing film is constituted by an uppermost layer and a plurality of layers under the uppermost layer, and
    the plurality of layers contain Ta and are configured so that a content of N increases upward.

* * * * *